(12) United States Patent
Schultz et al.

(10) Patent No.: US 10,396,768 B2
(45) Date of Patent: Aug. 27, 2019

(54) CIRCUITS WITH LOW-PASS FILTERS AND DIFFERENTIAL AMPLIFIERS

(71) Applicant: TEXAS INSTRUMENTS INCORPORATED, Dallas, TX (US)

(72) Inventors: Michael Schultz, Munich (DE); Robert Callaghan Taft, Munich (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/951,973

(22) Filed: Apr. 12, 2018

(65) Prior Publication Data

US 2018/0302075 A1    Oct. 18, 2018

Related U.S. Application Data

(60) Provisional application No. 62/485,345, filed on Apr. 13, 2017.

(51) Int. Cl.
*H03K 5/04* (2006.01)
*H03K 5/156* (2006.01)
*H03K 5/135* (2006.01)

(52) U.S. Cl.
CPC ............. *H03K 5/1565* (2013.01); *H03K 5/04* (2013.01); *H03K 5/135* (2013.01)

(58) Field of Classification Search
CPC ........ H03K 5/1565; H03K 5/135; H03K 5/04; H03K 5/01
See application file for complete search history.

(56) References Cited

U.S. PATENT DOCUMENTS

| 4,959,557 | A | * | 9/1990 | Miller | .................. | H03K 5/1565 |
| | | | | | | 327/175 |
| 5,057,702 | A | * | 10/1991 | Kitagawa | ............. | H03K 5/1565 |
| | | | | | | 327/175 |
| 6,407,596 | B1 | | 6/2002 | Taft et al. | | |
| 7,495,491 | B2 | * | 2/2009 | Wu | .................. | H03K 3/356104 |
| | | | | | | 327/172 |
| 7,525,358 | B1 | | 4/2009 | Taft et al. | | |
| 7,545,194 | B2 | | 6/2009 | Chen et al. | | |
| 2009/0091354 | A1 | * | 4/2009 | Aoki | .................... | H03K 5/1565 |
| | | | | | | 327/65 |

OTHER PUBLICATIONS

Zaki et al., "Design of a Quadrature Clock Conditioning Circuit in 90-nm CMOS Technology," 2008 International Conference on Microelectronics, Dec. 14-17, 2008, pp. 425-428.

* cited by examiner

*Primary Examiner* — Jung Kim
(74) *Attorney, Agent, or Firm* — John R. Pessetto; Charles A. Brill; Frank D. Cimino

(57) ABSTRACT

A circuit comprises a first set of serially-connected inverters comprising an input port, the first set of serially-connected inverters comprising a first subset of serially-connected inverters, the first subset of serially-connected inverters odd in number and comprising an input port and an output port; a first low-pass filter comprising an input port coupled to the output port of the first subset of serially-connected inverters, and an output port; a second low-pass filter comprising an input port coupled to the input port of the first subset of serially-connected inverters, and an output port; and a first differential amplifier comprising a first input port coupled to output port of the first low-pass filter, a second input port coupled to the output port of the second low-pass filter, and an output port coupled to the input port of the first set of serially-connected inverters.

11 Claims, 2 Drawing Sheets

CIRCUITS WITH LOW-PASS FILTERS AND DIFFERENTIAL AMPLIFIERS

CROSS-REFERENCE TO RELATED APPLICATIONS

The present application claims priority to U.S. Provisional Patent Application No. 62/485,345, which was filed Apr. 13, 2017, is titled "CLOCK RECEIVER WITH DUTY-CYCLE CORRECTION AND PHASE ERROR CORRECTION," and is hereby incorporated herein by reference in its entirety.

BACKGROUND

In many high-speed electronic circuits, a high-frequency clock signal is distributed over traces on a printed circuit board (PCB) to one or more circuits on the PCB, such as an analog-to-digital converter (ADC). A clock receiver is a circuit that, in response to receiving the distributed (external) high-frequency clock signal, provides internal clock signals for clocking one or more circuits.

SUMMARY

In accordance with at least one example of the disclosure, a circuit comprising: a first set of serially-connected inverters comprising an input port, the first set of serially-connected inverters comprising a first subset of serially-connected inverters, the first subset of serially-connected inverters odd in number and comprising an input port and an output port; a first low-pass filter comprising an input port coupled to the output port of the first subset of serially-connected inverters, and an output port; a second low-pass filter comprising an input port coupled to the input port of the first subset of serially-connected inverters, and an output port; and a first differential amplifier comprising a first input port coupled to output port of the first low-pass filter, a second input port coupled to the output port of the second low-pass filter, and an output port coupled to the input port of the first set of serially-connected inverters.

In accordance with at least one example of the disclosure, a circuit comprising: a first clock signal input port; a first inverter comprising an input port coupled to the first clock signal input port, and an output port; a second inverter comprising an input port coupled to the output port of the first inverter, and an output port; a third inverter comprising an input port coupled to the output port of the second inverter, and an output port; a fourth inverter comprising an input port coupled to the output port of the third inverter, and an output port; a first low-pass filter comprising an input port coupled to the output port of the third inverter, and an output port; a second low-pass filter comprising an input port coupled to the output port of the fourth inverter, and an output port; and a first differential amplifier comprising a first input port coupled to output port of the first low-pass filter, a second input port coupled to the output port of the second low-pass filter, and an output port coupled to the input port of the first inverter.

In accordance with at least one example of the disclosure, a circuit comprising: a first clock signal input port; a first set of serially-connected inverters coupled to the first clock signal input port; a first low-pass filter comprising an input port coupled to the first set of serially-connected inverters, and an output port; a second low-pass filter comprising an input port coupled to the first set of serially-connected inverters, and an output port; and a first differential amplifier comprising a first input port coupled to output port of the first low-pass filter, a second input port coupled to the output port of the second low-pass filter, and an output port coupled to the first set of serially-connected inverters; a second clock signal input port; a second set of serially-connected inverters coupled to the second clock signal input port; a third low-pass filter comprising an input port coupled to the second set of serially-connected inverters, and an output port; a fourth low-pass filter comprising an input port coupled to the second set of serially-connected inverters, and an output port; and a second differential amplifier comprising a first input port coupled to output port of the third low-pass filter, a second input port coupled to the output port of the fourth low-pass filter, and an output port coupled to the second set of serially-connected inverters.

BRIEF DESCRIPTION OF THE DRAWINGS

For a detailed description of various examples, reference will now be made to the accompanying drawings in which.

DETAILED DESCRIPTION

In many high-speed clocked systems, the duty cycle of a clock signal distributed over PCB traces may not be as intended due to the limited bandwidth of the PCB traces. As an example of a high-speed clocked system, to enable an ADC to accurately sample data at 6.4 GSPS with double-edge-sampling (DES), an accurate 3.2 GHZ external clock signal is propagated on PCB traces to the ADC. In response to the external clock signal, a circuit on the ADC generates two internal clock signals to clock the ADC, where it is desirable to have a 50% duty cycle and a relative phase offset of 180° for the two internal clock signals. However, it can be difficult to provide an accurate duty cycle of 50% with an accurate relative phase offset of 180°. Because of the limited bandwidth of the PCB traces, higher order harmonics are strongly damped, and the propagated clock signal on the PCB traces can approach a sinusoidal waveform. This leads to phase offsets being small and most likely caused by PCB trace length mismatch. For example, a 1 mm trace mismatch on a FR4 PCB with a dielectric constant of 4.4 would lead to a 7 ps timing mismatch between the first and second clock signals. For a 3.2 GHz signal, this corresponds to 8.06° phase offset.

A circuit according to embodiments includes self-referencing duty-cycle correction. The circuit can be employed as a clock receiver to correct the duty cycle of a received single-ended clock signal or a received differential clock signal. The circuit can also be employed as a circuit module or sub-circuit to correct the duty cycle of an internally distributed clock signal. In the latter case, for convenience the internally distributed clock signal will also be referred to as a received clock signal. Embodiments are applicable to correcting the duty cycle of a received clock signal for which the duty cycle is intended to be 50%.

Figure 1:
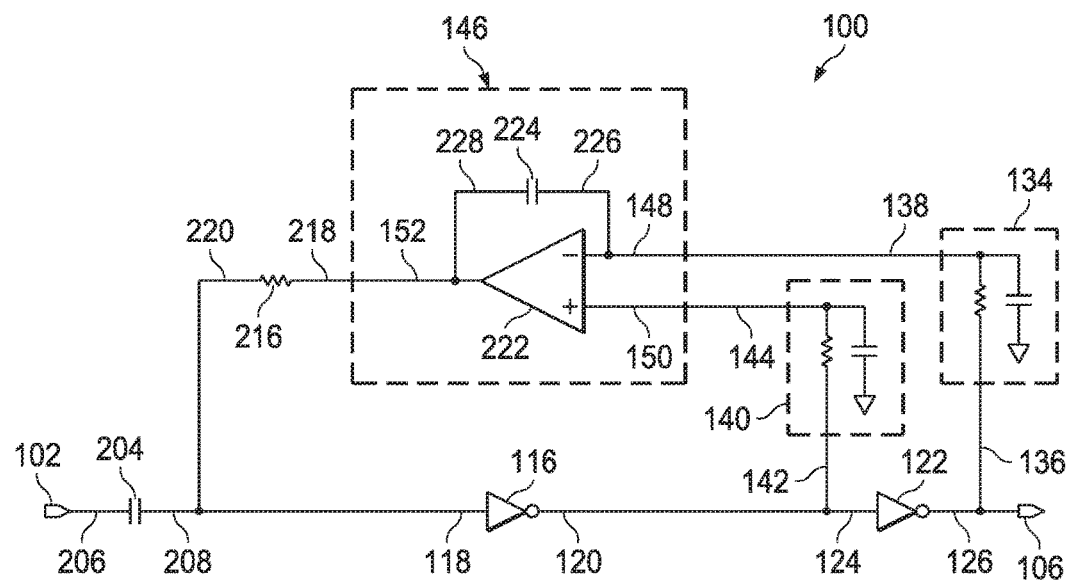
FIG. 1 shows a circuit in accordance with various examples.

FIG. 1 depicts an illustrative circuit 100 for correcting the duty cycle of a single-ended clock signal. The illustrative circuit 100 comprises a first clock signal input port 102 to receive the single-ended clock signal. In many applications, the singled-ended clock signal should ideally have a 50% duty cycle. However, due to clock propagation affects and process variation, the duty cycle may not be exactly 50%. The illustrative circuit 100 corrects the duty cycle to provide an output clock signal at a first output port 106. The output clock signal can be used to clock other circuits (not shown), such as an ADC.

The illustrative circuit 100 includes a first set of serially-connected inverters coupled to the first clock signal input port 102, comprising an inverter 116 comprising an input port 118, and an output port 120; and an inverter 122 comprising an input port 124 coupled to the output port 120 of the inverter 116, and an output port 126. The output port 126 of the inverter 122 is coupled to the first output port 106. The input port 118 is also the input port of the first serially-connected inverters.

In some embodiments, the inverter 122 may be replaced by a first subset of serially-connected inverters of odd number. Accordingly, the first set of serially-connected inverters comprises the first subset of serially-connected inverters, where the first subset of serially-connected inverters comprises the input port 124 and the output port 126. In the particular embodiment of FIG. 1, the first subset of serially-connected inverters is the inverter 122.

The illustrative circuit 100 further includes a first low-pass filter 134 comprising an input port 136 coupled to the output port 126 of the first subset of serially-connected inverters (e.g., the inverter 122), and an output port 138; a second low-pass filter 140 comprising an input port 142 coupled to the input port 124 of the first subset of serially-connected inverters, and an output port 144; and a first differential amplifier 146 comprising a first input port 148 coupled to output port 138 of the first low-pass filter 134, a second input port 150 coupled to the output port 144 of the second low-pass filter 140, and an output port 152 coupled to the input port 118 of the first set of serially-connected inverters.

The illustrative circuit 100 further includes a first coupling capacitor 204 comprising a first terminal 206 coupled to the first clock signal input port 102, and a second terminal 208 coupled to the input port 118 of the first set of serially-connected inverters. The illustrative circuit 100 further includes a first resistor 216 comprising a first terminal 218 coupled to the output port 152 of the first differential amplifier 146, and a second terminal 220 coupled to the input port 118 of the first set of serially-connected inverters. The first differential amplifier 146 comprises an operational amplifier (OPAMP) 222 and a capacitor 224, the capacitor 224 of the first differential amplifier 146 comprising a first terminal 226 coupled to the first input port 148 of the first differential amplifier 146 and a second terminal 228 coupled to the output port 152 of the first differential amplifier 146.

The first low-pass filter 134 averages the signal at the output port 126 and the second low-pass filter 140 averages the signal at the input port 124. Because these two signals are related by an inversion, if the duty cycle of the received clock signal is 50%, then the first differential amplifier 146 does not apply a correction to the input port 118. However, if the duty cycle is not 50%, then the duty cycle at the input port 124 is not matched to the duty cycle at the output port 126 (they are complementary to each other), and the first differential amplifier 146 applies a correction to the input port 118. In this way, the illustrative circuit 100 corrects the duty cycle to 50%.

In the particular embodiment of FIG. 1, the first input port 148 is coupled to the inverting input port of the OPAMP 222, and the second input port 150 is coupled to the non-inverting input port of the OPAMP 222. In some embodiments, the inverter 116 may be replaced with serially-connected inverters, where if the number of serially-connected inverters replacing the inverter 116 is odd, then the first input port 148 is coupled to the inverting input port of the OPAMP 222 and the second input port 150 is coupled to the non-inverting input port of the OPAMP 222, whereas if the number of serially-connected inverters replacing the inverter 116 is even, then the first input port 148 is coupled to the non-inverting input port of the OPAMP 222 and the second input port 150 is coupled to the inverting input port of the OPAMP 222. A specific example of this will be discussed with respect to the embodiment of FIG. 2.

Figure 2:
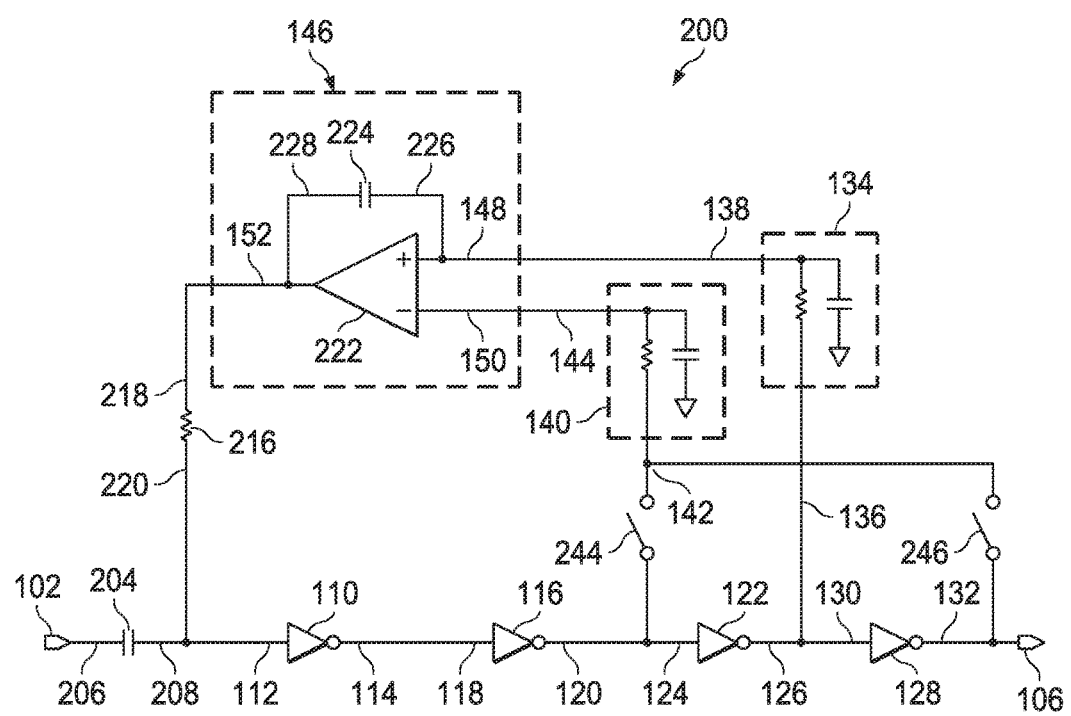
FIG. 2 shows a circuit in accordance with various examples.

FIG. 2 depicts an illustrative circuit 200 for correcting the duty cycle of a single-ended clock signal. The embodiment of FIG. 2 is similar to that of FIG. 1, but an inverter 110 is connected in series to the inventor 116, where the inverter 110 has an input port 112 coupled to the first clock signal input port 102 and an output port 114 coupled to the input port 118; and the embodiment of FIG. 2 further includes an inverter 128 with an input port 130 coupled to the output port 126 of the inverter 122, and an output port 132 coupled to the first output port 106. Because the illustrative circuit 200 includes two inverters serially connected between the first clock signal input port 102 and the second low-pass filter 140, the first input port 148 is coupled to the non-inverting input port of the OPAMP 222 and the second input port 150 is coupled to the inverting input port of the OPAMP 222.

The illustrative circuit 200 includes a first switch 244 to couple the input port 142 of the second low-pass filter 140 to the output port 120 of the inverter 116 and a second switch 246 to couple the input port 142 of the second low-pass filter 140 to the output port 132 of the inverter 128. The first switch 244 or the second switch 246 can be implemented as a single transistor, a pair of transistors of p-type and n-type (commonly referred to as a transmission gate), or a more complex circuit to implement a switching function. At most only one of the switches 244 and 246 is switched on during a particular operational mode, so as to vary the gain of the illustrative circuit 200.

In the particular embodiment of FIG. 2, the first subset of serially-connected inverters is identified with the inverter 128 when the switch 246 is on (closed), and the first subset of serially-connected inverters is identified with the inverter 122 when the switch 244 is on (closed). In some embodiments, the inverter 128 can be replaced with an odd number of serially-connected inverters. In some embodiments, the inverter 122 can be replaced with an odd number of serially-connected inverters.

Figure 3:
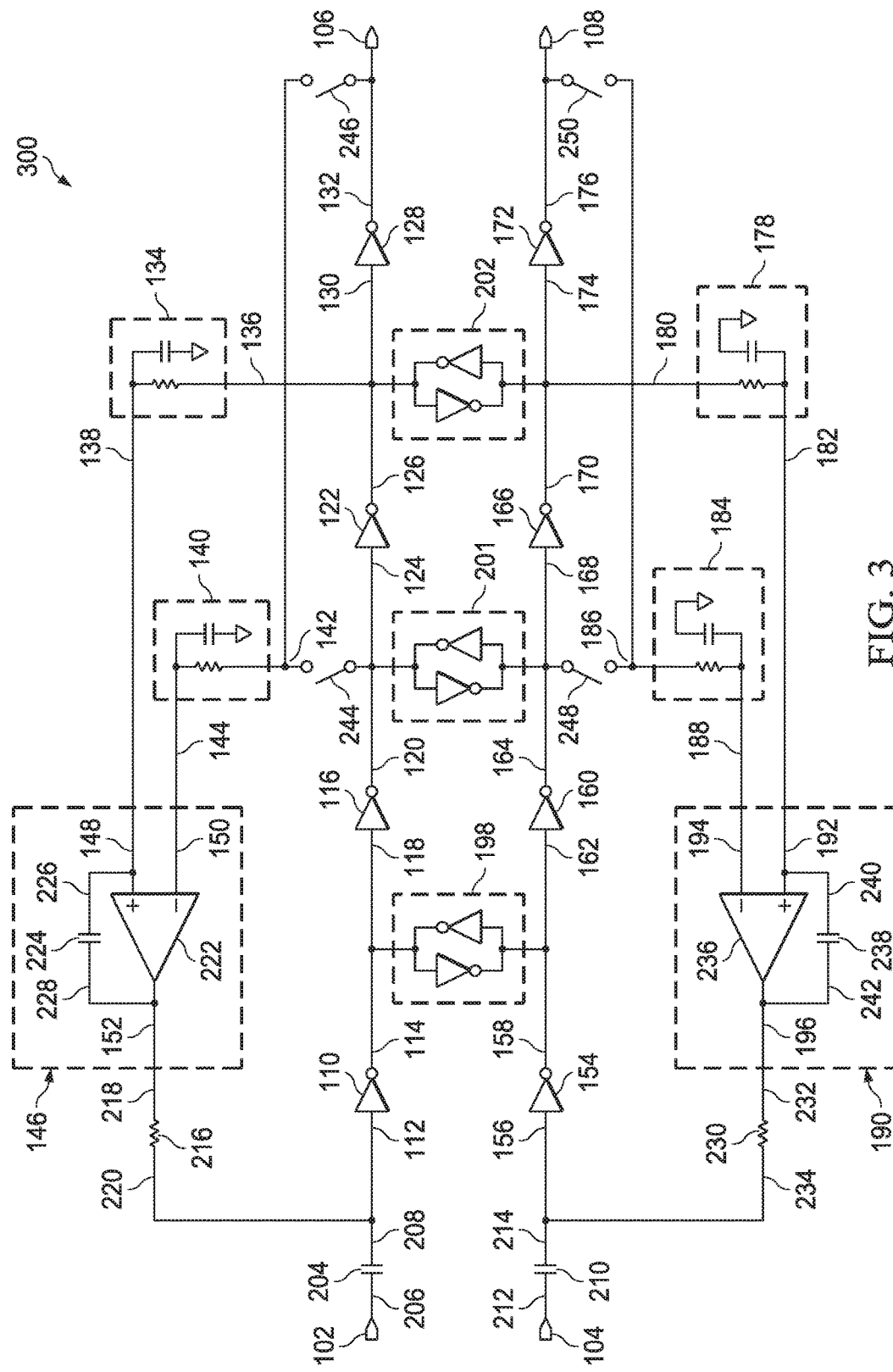
FIG. 3 shows a circuit in accordance with various examples.

FIG. 3 depicts an illustrative circuit 300 for correcting the duty cycle of a clock signal. The illustrative circuit 300 comprises a first clock signal input port 102 and a second clock signal input port 104. In operation of the illustrative circuit 300, the first and second clock signal input ports 102 and 104 receive, respectively, first and second clock signals. The first and second clock signals together comprise a clock signal distributed over PCB traces (not shown), and the clock signal can be a common mode logic (CML) signal. In some embodiments, the differential signal applied to the clock signal input ports may originate from the same semiconductor device and can be either a CML signal or a signal with full-swing logic levels.

In many applications, the first and second clock signals should ideally each have a 50% duty cycle and a relative phase offset (difference) of 180°. However, due to clock propagation affects and process variation, the duty cycle of the first and second clock signals is not exactly 50% and the relative phase offset is not exactly 180°. The illustrative circuit 300 corrects the duty cycle and the relative phase offset of the first and second clock signals so as to provide a first output clock signal and a second output clock signal at a first output port 106 and a second output port 108, respectively, each having a duty cycle closer to 50% and a relative phase offset closer to 180° than that of the received first and second clock signals. The first and second output clock signals can be used to clock other circuits (not shown), such as an ADC.

The illustrative circuit 300 includes a first set of serially-connected inverters coupled to the first clock signal input port 102, comprising: a first inverter 110 comprising an input port 112 coupled to the first clock signal input port 102, and an output port 114; a second inverter 116 comprising an input port 118 coupled to the output port 114 of the first inverter 110, and an output port 120; a third inverter 122 comprising an input port 124 coupled to the output port 120 of the second inverter 116, and an output port 126; and a fourth inverter 128 comprising an input port 130 coupled to the output port 126 of the third inverter 122, and an output port 132. The output port 132 of the fourth inverter 128 is coupled to the first output port 106.

The illustrative circuit 300 further includes: a first low-pass filter 134 comprising an input port 136 coupled to the first set of serially-connected inverters, and an output port 138; a second low-pass filter 140 comprising an input port 142 coupled to the first set of serially-connected inverters, and an output port 144; and a first differential amplifier 146 comprising a first input port 148 coupled to output port 138 of the first low-pass filter 134, a second input port 150 coupled to the output port 144 of the second low-pass filter 140, and an output port 152 coupled to the first set of serially-connected inverters.

The illustrative circuit 300 further includes a second set of serially-connected inverters coupled to the second clock signal input port 104, comprising: a fifth inverter 154 comprising an input port 156 coupled to the second clock signal input port 104, and an output port 158; a sixth inverter 160 comprising an input port 162 coupled to the output port 158 of the fifth inverter 154, and an output port 164; a seventh inverter 166 comprising an input port 168 coupled to the output port 164 of the sixth inverter 160, and an output port 170; and an eighth inverter 172 comprising an input port 174 coupled to the output port 170 of the seventh inverter 166, and an output port 176. The output port 176 of the eighth inverter 172 is coupled to the second output port 108 of the illustrative circuit 300.

The illustrative circuit 300 further includes a third low-pass filter 178 comprising an input port 180 coupled to the second set of serially-connected inverters, and an output port 182; a fourth low-pass filter 184 comprising an input port 186 coupled to the second set of serially-connected inverters, and an output port 188; and a second differential amplifier 190 comprising a first input port 192 coupled to output port 182 of the third low-pass filter 178, a second input port 194 coupled to the output port 188 of the fourth low-pass filter 184, and an output port 196 coupled to the second set of serially-connected inverters.

As in the illustrative circuits 100 and 200 shown in FIG. 1 and FIG. 2, in some embodiments the inverters 128 and 172 can be replaced with an odd number of serially-connected inverters, where for matching of the top-half and bottom-half clock paths, both inverters 128 and 172 can be replaced by the same number of serially-connected inverters, which may allow additional cross-coupled inverters, similar to a third pair of cross-coupled inverters 202 (described below). Similarly, the inverters 122 and 166 can be replaced with an odd number of serially-connected inverters. Furthermore, the inverter pair 110 and 116 as well as the inverter pair 154 and 160 can each be replaced by an identical number of serially-connected inverters, both either even or odd. As described for the illustrative circuit 100, whether the number of inverters is odd or even determines the polarity of the connections to the OPAMP 222 and the OPAMP 236 to ensure that the control loops for the top-half and bottom-half clock paths both have negative feedback.

The illustrative circuit 300 further includes pairs of cross-coupled inverters coupling the first set of serially-connected inverters to the second set of serially-connected inverters, comprising: a first pair of cross-coupled inverters 198 coupled to the output port 114 of the first inverter 110 and to the output port 158 of the fifth inverter 154; a second pair of cross-coupled inverters 201 coupled to the output port 120 of the second inverter 116 and to the output port 164 of the sixth inverter 160; and a third pair of cross-coupled inverters 202 coupled to the output port 126 of the third inverter 122 and to the output port 170 of the seventh inverter 166.

The illustrative circuit 300 further includes: a first coupling capacitor 204 comprising a first terminal 206 coupled to the first clock signal input port 102, and a second terminal 208 coupled to the input port 112 of the first inverter 110; and a second coupling capacitor 210 comprising a first terminal 212 coupled to the second clock signal input port 104, and a second terminal 214 coupled to the input port 156 of the fifth inverter 154. In this way, the first coupling capacitor 204 capacitively couples the first set of serially-connected inverters (comprising 110, 116, 122, and 128) to the first clock signal input port 102, and the second coupling capacitor 210 capacitively couples the second set of serially-connected inverters (comprising 154, 160, 166, and 172) to the second clock signal input port 104.

The illustrative circuit 300 further includes a first resistor 216 comprising a first terminal 218 coupled to the output port 152 of the first differential amplifier 146, and a second terminal 220 coupled to the input port 112 of the first inverter 110. The first differential amplifier 146 comprises an operational amplifier (OPAMP) 222 and a capacitor 224, the capacitor 224 of the first differential amplifier 146 comprising a first terminal 226 coupled to the first input port 148 of the first differential amplifier 146 and a second terminal 228 coupled to the output port 152 of the first differential amplifier 146.

The illustrative circuit 300 further includes a second resistor 230 comprising a first terminal 232 coupled to the output port 196 of the second differential amplifier 190, and a second terminal 234 coupled to the input port 156 of the fifth inverter 154. The second differential amplifier 190 comprises an OPAMP 236 and a capacitor 238, the capacitor 238 of the second differential amplifier 190 comprising a first terminal 240 coupled to the first input port 192 of the second differential amplifier 190 and a second terminal 242 coupled to the output port 196 of the second differential amplifier 190.

The illustrative circuit 300 further includes: a first switch 244 to couple the input port 142 of the second low-pass filter 140 to the output port 120 of the second inverter 116; a second switch 246 to couple the input port 142 of the second low-pass filter 140 to the output port 132 of the fourth inverter 128; a third switch 248 to couple the input port 186 of the fourth low-pass filter 184 to the output port 164 of the sixth inverter 160; and a fourth switch 250 to couple the input port 186 of the fourth low-pass filter 184 to the output port 176 of the eighth inverter 172. As discussed previously with respect to the first switch 244 and the second switch 246, the third switch 248 or the fourth switch 250 can be implemented as a single transistor, a pair of transistors of p-type and n-type (a transmission gate), or a more complex circuit to implement a switching function. At most only one of the switches 248 and 250 is switched on during a particular operational mode, so as to vary the gain of the illustrative circuit 300.

The second set of serially-connected inverters comprises a second subset of serially-connected inverters, where the second subset of serially-connected inverters comprises the seventh inverter 166 when the third switch 248 is closed or the eighth inverter 172 when the fourth switch 250 is closed. When the third switch 248 is closed, the input port 168 and the output port 170 are input and output ports, respectively, for the second subset of serially-connected inverters. When the fourth switch 250 is closed, the input port 174 and the output port 176 are input and output ports, respectively, for the second subset of serially-connected inverters. Because the second subset of serially-connected inverters comprises the seventh inverter 166 or the eighth inverter 172 (depending upon the states of the third switch 248 and the fourth switch 250), the second subset of serially-connected inverters is odd in number.

In operation, only one of the first switch 244 and the second switch 246 is turned on at any particular time interval, with the selection of turning on either of the first or second switches 244 and 246 determining a gain of the upper-half of the illustrative circuit 300. Similarly, in operation, only one of the third switch 248 and the fourth switch 250 is turned on at any particular time interval, with the selection of turning on either of the third or fourth switches 248 and 250 determining a gain of the lower-half of the illustrative circuit 300.

Referring to the upper-half of the illustrative circuit 300, the first low-pass filter 134 averages the output of the third inverter 122. Depending upon which one of the first or second switches 244 and 246 is turned on, the first low-pass filter 134 averages the output of either the second inverter 116 or the fourth inverter 128. These averaged outputs will settle to a same voltage when the duty cycle of the first clock signal is 50%. The OPAMP 222 utilizes negative feedback with the capacitor 224, so that the small-signal capacitance seen at the first terminal 226 is the capacitance of the capacitor 224 multiplied by one plus the gain of the OPAMP 222, providing a dominant pole in the control loop. This capacitance increase at the input of an amplifier is often referred to as the Miller Effect, and results from the gain of an inverting amplifier driving the second terminal 228 of the capacitor 224 in the opposite direction, resulting in a much larger charge storage at the first terminal 226 of the capacitor 224. This larger charge storage is effectively equivalent to a larger input capacitance. The OPAMP 222 compares the two averaged output signals from the first and second low-pass filters 134 and 140 so that the first clock signal ac-coupled to the first set of serially-connected inverters is driven to a common mode that forces the first output clock signal at the first output port 106 to have 50% duty cycle. Similar remarks apply to the lower-half of the illustrative circuit 300, where the second output clock signal at the second output port 108 is driven by the OPAMP 236 to have 50% duty cycle. The gain provided by selecting which of the first and second switches 244 and 246 to turn on, and which of the third and fourth switches 248 and 250 to turn on, can be chosen to avoid stability problems, as the feedback topology has high gain due to the first and second differential amplifiers 146 and 190, and the two sets of serially-connected inverters contributing to the loop gain.

The pairs of cross-coupled inverters (198, 201, and 202) help provide phase correction. A pair of cross-coupled inverters can be referred to as a bus holder. When the phase between the two clock signals propagating in the first and second sets of serially-connected inverters is 180°, the pairs of cross-coupled inverters help support the rising and falling edge of the two clock signals propagating in the two sets of serially-connected inverters. If the phase between the two clock signals propagating in the first and second sets of serially-connected inverters is not 180°, then in each pair of cross-coupled inverters, the inverters will fight each other to align a clock signal propagating in one set of serially-connected inverters to an edge of a clock signal propagating in the other set of serially-connected inverters. In some embodiments, the inverters in a pair of cross-coupled inverters can be several times weaker than the inverters in the two sets of serially-connected inverters.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications. For example, the duty-cycle correction of an embodiment can be applied multiple times in a series clock path, and the number of inverters can be selected to address the needs of clock buffering.

What is claimed is:

1. A circuit comprising:
   a first set of serially-connected inverters comprising an input port, the first set of serially-connected inverters comprising a first subset of serially-connected inverters, the first subset of serially-connected inverters odd in number and comprising an input port and an output port;

a first low-pass filter comprising an input port coupled to the output port of the first subset of serially-connected inverters, and an output port;
a second low-pass filter comprising an input port coupled to the input port of the first subset of serially-connected inverters, and an output port; and
a first differential amplifier comprising a first input port coupled to output port of the first low-pass filter, a second input port coupled to the output port of the second low-pass filter, and an output port coupled to the input port of the first set of serially-connected inverters;
the first differential amplifier comprising a capacitor, the capacitor of the first differential amplifier comprising a first terminal coupled to the first input port of the first differential amplifier and a second terminal coupled to the output port of the first differential amplifier.

2. The circuit of claim 1, further comprising:
a first clock signal input port; and
a first coupling capacitor comprising a first terminal coupled to the first clock signal input port, and a second terminal coupled to the input port of the first set of serially-connected inverters.

3. The circuit of claim 1, further comprising:
a first resistor comprising a first terminal coupled to the output port of the first differential amplifier, and a second terminal coupled to the input port of the first set of serially-connected inverters.

4. The circuit of claim 3, further comprising:
a first clock signal input port; and
a first coupling capacitor comprising a first terminal coupled to the first clock signal input port, and a second terminal coupled to the input port of the first set of serially-connected inverters.

5. The circuit of claim 4, further comprising:
a second set of serially-connected inverters comprising an input port, the second set of serially-connected inverters comprising a second subset of serially-connected inverters, the second subset of serially-connected inverters odd in number and comprising an input port and an output port;
a third low-pass filter comprising an input port coupled to the output port of the second subset of serially-connected inverters, and an output port;
a fourth low-pass filter comprising an input port coupled to the input port of the second subset of serially-connected inverters, and an output port;
a second differential amplifier comprising a first input port coupled to output port of the third low-pass filter, a second input port coupled to the output port of the fourth low-pass filter, and an output port coupled to the input port of the second set of serially-connected inverters;
a second clock signal input port; and
a second coupling capacitor comprising a first terminal coupled to the second clock signal input port, and a second terminal coupled to the input port of the second set of serially-connected inverters.

6. A circuit comprising:
a first set of serially-connected inverters comprising an input port, the first set of serially-connected inverters comprising a first subset of serially-connected inverters, the first subset of serially-connected inverters odd in number and comprising an input port and an output port;
a first low-pass filter comprising an input port coupled to the output port of the first subset of serially-connected inverters, and an output port;
a second low-pass filter comprising an input port coupled to the input port of the first subset of serially-connected inverters, and an output port; and
a first differential amplifier comprising a first input port coupled to output port of the first low-pass filter, a second input port coupled to the output port of the second low-pass filter, and an output port coupled to the input port of the first set of serially-connected inverters;
the first set of serially-connected inverters comprising:
a first inverter comprising an input port coupled to the input port of the first set of serially-connected inverters, and an output port;
a second inverter comprising an input port coupled to the output port of the first inverter, and an output port;
a third inverter comprising an input port coupled to the output port of the second inverter, and an output port; and
a fourth inverter comprising an input port coupled to the output port of the third inverter, and an output port;
wherein the first subset of serially-connected inventors comprises the third inverter;
a first switch to couple the input port of the second low-pass filter to the output port of the second inverter;
a second switch to couple the input port of the second low-pass filter to the output port of the fourth inverter;
a first clock signal input port;
a second clock signal input port;
a fifth inverter comprising an input port coupled to the second clock signal input port, and an output port;
a first pair of cross-coupled inverters coupled to the output port of the first inverter and to the output port of the fifth inverter;
a sixth inverter comprising an input port coupled to the output port of the fifth inverter, and an output port;
a second pair of cross-coupled inverters coupled to the output port of the second inverter and to the output port of the sixth inverter;
a seventh inverter comprising an input port coupled to the output port of the sixth inverter, and an output port;
a third pair of cross-coupled inverters coupled to the output port of the third inverter and to the output port of the seventh inverter;
a third low-pass filter comprising an input port coupled to the output port of the seventh inverter, and an output port;
a fourth low-pass filter comprising an input port coupled to the output port of the sixth inverter, and an output port; and
a second differential amplifier comprising a first input port coupled to output port of the third low-pass filter, a second input port coupled to the output port of the fourth low-pass filter, and an output port coupled to the input port of the fifth inverter.

7. The circuit of claim 6, further comprising a third switch to couple the input port of the fourth low-pass filter to the output port of the sixth inverter.

8. The circuit of claim 7, further comprising:
an eighth inverter comprising an input port coupled to the output port of the seventh inverter, and an output port; and
a fourth switch to couple the input port of the fourth low-pass filter to the output port of the eighth inverter.

9. The circuit of claim 8, further comprising:
a first coupling capacitor comprising a first terminal coupled to the first clock signal input port, and a second terminal coupled to the input port of the first inverter; and a second coupling capacitor comprising a first terminal coupled to the second clock signal input port, and a second terminal coupled to the input port of the fifth inverter.

10. The circuit of claim 9, further comprising:

a first resistor comprising a first terminal coupled to the output port of the first differential amplifier, and a second terminal coupled to the input port of the first inverter; and a second resistor comprising a first terminal coupled to the output port of the second differential amplifier, and a second terminal coupled to the input port of the fifth inverter.

11. The circuit of claim 10, the first differential amplifier comprising a capacitor, the capacitor of the first differential amplifier comprising a first terminal coupled to the first input port of the first differential amplifier and a second terminal coupled to the output port of the first differential amplifier; and the second differential amplifier comprising a capacitor, the capacitor of the second differential amplifier comprising a first terminal coupled to the first input port of the second differential amplifier and a second terminal coupled to the output port of the second differential amplifier.

* * * * *